United States Patent
Magoon et al.

(10) Patent No.: US 6,753,727 B2
(45) Date of Patent: Jun. 22, 2004

(54) SEQUENTIAL DC OFFSET CORRECTION FOR AMPLIFIER CHAIN

(75) Inventors: Rahul Magoon, Irvine, CA (US); Alyosha C. Molnar, Berkeley, CA (US)

(73) Assignee: Skyworks Solutions, Inc., Irvine, CA (US)

(*) Notice: Subject to any disclaimer, the term of this patent is extended or adjusted under 35 U.S.C. 154(b) by 15 days.

(21) Appl. No.: 10/170,507

(22) Filed: Jun. 13, 2002

(65) Prior Publication Data

US 2003/0231054 A1 Dec. 18, 2003

(51) Int. Cl.$^7$ ................................ H03F 1/02
(52) U.S. Cl. ..................... 330/9; 330/150; 330/306
(58) Field of Search ................... 330/9, 51, 150, 330/306; 327/124, 307

(56) References Cited

U.S. PATENT DOCUMENTS 6,009,126 A * 12/1999 Van Bezooijen ............ 375/319
6,240,100 B1 * 5/2001 Riordan et al. ............. 370/442

* cited by examiner

Primary Examiner—Steven J. Mottola
(74) Attorney, Agent, or Firm—Mintz Levin Cohn Ferris Glovsky & Popeo, P.C.

(57) ABSTRACT

An amplifier chain with sequential DC offset correction for use in a radio receiver is provided. The amplifier chain has at least first and second amplifier stages connected in series. The first and second stages include an amplifier and a track and hold circuit connected in parallel across the amplifier. The track and hold circuit has a tracking state and a holding state. A control signal is coupled to the track and hold circuits of the first and second stages. The control signal is configured to set the track and hold circuits to the tracking state, which may be done simultaneously, and to sequentially set the track and hold circuit of the first stage to the holding state and then set the track and hold circuit of the second stage to the holding state.

21 Claims, 6 Drawing Sheets

SEQUENTIAL DC OFFSET CORRECTION FOR AMPLIFIER CHAIN

FIELD OF THE INVENTION

This invention relates generally to the field of amplifiers and more particularly to high gain amplifiers.

RELATED ART

Known wireless telephones include, but are not limited to, analog telephones using analog transmission formats, such as circuits using the AMPS standard, and to digital telephones using digital transmission formats, such as TDMA (time division multiple access) applications, including, but not limited to standards such as IS-136, GSM and next generation ("G3") wireless telephone standards.

Increased battery life is one of the advantages that digital wireless telephones have over analog wireless telephones. For example, while in a standby mode (such as when the telephone is on, but not engaged in a telephone call), an analog telephone typically continuously monitors channels that are available for incoming telephone calls. Also, during a wireless telephone call, the receive circuit of an analog telephone is typically continuously receiving a telephone transmission.

Digital telephones, on the other hand, may be "powered down" for predetermined periods, conserving battery power and extending battery life. For example, while in standby mode, a digital wireless telephone, such as one using a TDMA format, typically activates the receive circuitry for only one or two timeslots of a frame of available timeslots. Similarly, during a wireless telephone call, the receive circuit of a digital telephone typically receives a telephone transmission only during predetermined timeslots of a frame of available timeslots. During inactive timeslots, the receive circuitry may be put in a low-power state, to conserve power.

In any TDMA application, time is divided up into frames having discrete timeslots. For example, in GSM the TDMA frame is approximately 4.6 milliseconds long. In GSM each frame is divided into 8 timeslots of approximately 577 micro seconds each. In every frame, one or two timeslots are used for receiving and one or two timeslots are used for transmitting.

The transition from a low-power state to an active state is not necessarily instantaneous. Accordingly, the time required to bring the receive circuitry from a low-power state to an active state is one of the considerations in designing receive circuitry. The shorter the time to transition from the low-power state to the active state, the longer the low-power state may be maintained, so as to enhance battery life.

Another consideration in designing receive circuitry for digital telephones is the amplification of received signals prior to analog to digital conversion. Typically, received signals are amplified by a high gain receiver chain having one or more stages of high gain amplifiers. One of the problems in such a high gain receiver chain may be the presence of direct current ("DC") offsets. Such DC offsets, if uncorrected, may be amplified to the level where the DC offsets would saturate one or more of the stages of the high-gain receiver.

DC offsets in high gain receiver chains may be caused by offsets that are unintentionally built in to the receiver due to mismatches in the devices used in the receiver circuitry. DC Offsets may also be caused by the coupling of local oscillator (LO) input signals to the radio frequency (RF) port. Coupling of large RF input signals to the LO port may also cause DC offsets, but such offsets are more difficult to correct due to the varying of RF signal strength.

In a digital wireless telephone, a typical receiver may include an antenna, coupled by an amplifier to a direct conversion mixer, which is in turn coupled by a high-gain receiver amplifier to one or more analog to digital converters (AID converters). A direct conversion mixer mixes a radio-frequency (RF) signal with a local oscillator (LO) signal to shift modulated channels, which are centered at RF frequencies when received, so that they are centered around a direct current (DC) reference. Alternatively, a receiver circuit may include an RF to intermediate frequency (IF) converter, with the RF to IF converter coupled to an IF to baseband mixer.

The output at low frequencies is referred to as a baseband signal. The baseband outputs of a receiver are typically required to be quadrature (phases differing by 90 degrees) so that they are able to convey the phase information in-phase modulated channels. The I (in-phase) signal and Q (quadrature phase) signal are the baseband signals, Further amplification of the I and Q signals is typically performed before these signals can be input to the AID converters. An undesirable aspect of the amplification of the I and Q signals is the amplification of any DC offsets that may be present at the I and Q outputs of the mixer. The high-gain receiver chain may also add its own DC offsets due to mismatch in the circuitry that forms the baseband amplifiers.

After amplification, the I and Q baseband signals are then input to the A/D converters. The A/D converters form the input stages to the digital processing circuitry that comprises the coding and decoding sections of modem digital telephones. The signals are demodulated in the digital sections.

Also, a high gain receiver amplifier, or chain of amplifiers, typically is designed with limited bandwidth. The high gain receiver amplifier is typically filters out undesirable signals that may have been mixed down with the desired radio signal. The settling time of a chain of amplifiers in the high gain receiver amplifier is inversely proportional to its bandwidth. Thus, the narrower the bandwidth, the longer the settling time. In high gain receiver amplifiers used in typical wireless telephone applications, bandwidths are relatively narrow leading to relatively long settling times. However, because TDMA time slots are of finite duration, an amplifier chain needs to settle down an d be corrected for DC offset within a reasonable time.

In order to eliminate the DC offsets, in TDMA based systems, it is known to include circuitry that measures the DC offsets and provide correction control voltage information that is stored on a discrete holding capacitor during the receiving TDMA slot. Previous solutions have used an external, discrete holding capacitor. The additional holding capacitors, however, add expense to a wireless telephone and occupy area on a circuit board, which runs contrary to design goals to lower the cost and reduce the size of wireless telephones. Also, the prior solution does not address the long settling time for amplifiers having narrow bandwidth filters.

SUMMARY

An amplifier chain with sequential DC offset correction for use in a radio receiver is provided. The amplifier chain has at least first and second amplifier stages connected in series. The first and second stages include an amplifier and a track and hold circuit connected in parallel across the amplifier. The track and hold circuit has a tracking state and a holding state. A control signal is coupled to the track and hold circuits of the first and second stages. The control signal is configured to set the track and hold circuits to the tracking state, which may be done simultaneously, and to sequentially set the track and hold circuit of the first stage to the holding state and then set the track and hold circuit of the second stage to the holding state.

In one example, the track and hold circuit may be an analog circuit having a holding capacitor and an amplifier. The amplifier has a tracking input coupled to the stage output and a tracking output selectively coupled to the holding capacitor when the track and hold circuit is in the tracking state. A buffer is connected to the holding capacitor, and is selectively coupled to the stage input when the track and hold circuit is in the holding state. In another example, the track and hold circuit may be a digital circuit having a comparator, a counter, a digital to analog converter and a data register. The comparator has a first input connected to a DC offset current from the amplifier stage, a second input, connected to a reference signal, and an output. The counter has an input coupled to the output of the comparator and a correction current output. The digital to analog converter has an input connected to the output of the counter and an output connected to the first input of the comparator and summed with the DC offset current from the amplifier stage. The data register is connected to the output of the counter.

In another embodiment, one or more stages of the amplifier chain may include a low pass filter having a narrow bandwidth state and a high bandwidth state coupled in series with the amplifiers. A high bandwidth control signal is coupled to the low pass filter, and is capable of setting the low pass filter to the high bandwidth state during DC offset correction to reduce settling time.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessary to scale, emphasis instead being placed upon illustrating the principles of the invention. Moreover, in the figures, like reference numerals designate corresponding parts throughout the different views.

DETAILED DESCRIPTION

Figure 1:
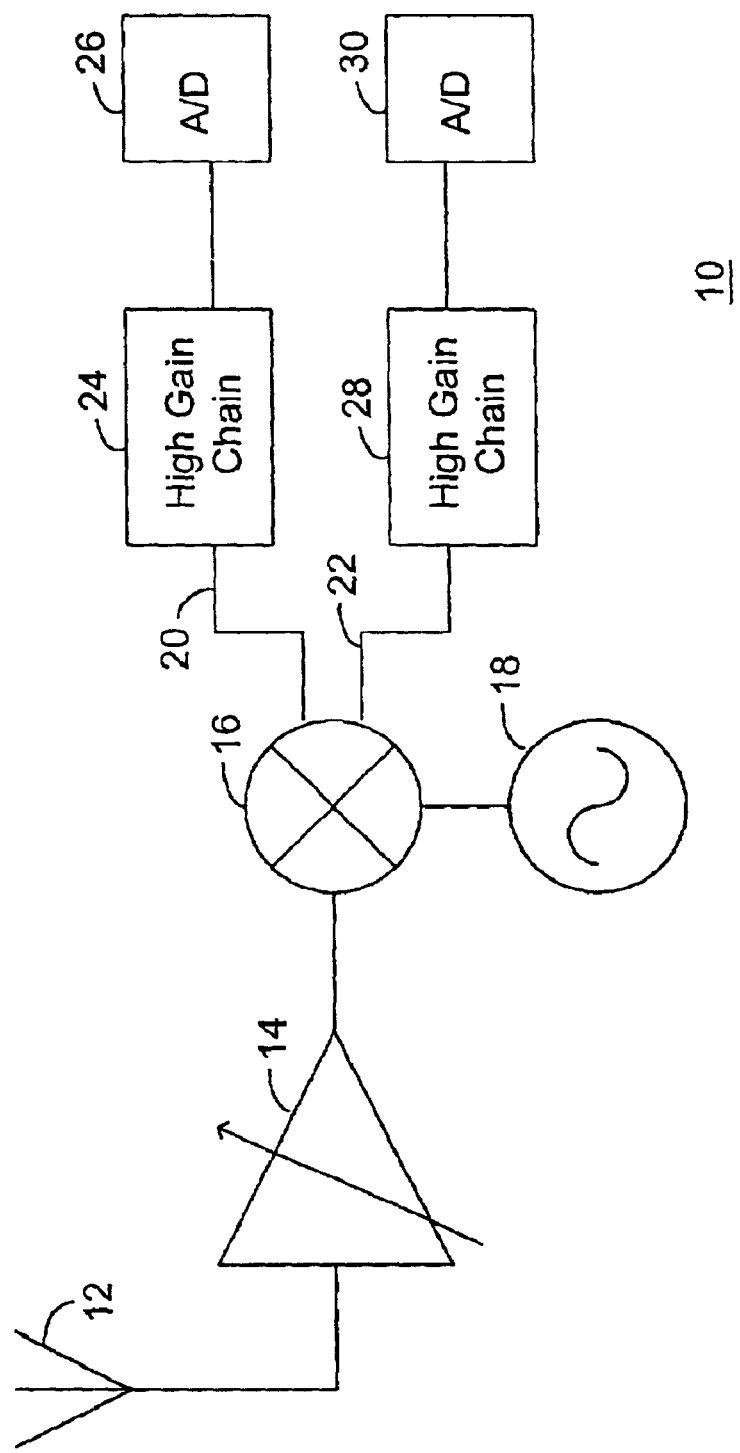
FIG. 1 is a functional block diagram illustrating an example of a digital radio receiver.

FIG. 1 is a block diagram illustrating an example of a radio receiver 10. While the illustrated receiver is intended for use in TDMA digital telephones, the invention is not limited to use in TDMA receivers or wireless telephones.

The example of radio receiver 10 illustrated in FIG. 1 includes an antenna 12 coupled to an RF amplifier 14. The RF amplifier 14 may be a variable gain amplifier as shown. A control signal may control the gain of the RF amplifier 14, or disable the output of the RF amplifier 14. The output of the RF amplifier 14 is coupled to a mixer 16. A local oscillator 18 is also coupled to the mixer 16. The mixer 16 outputs in-phase (I) and quadrature-phase (Q) signals 20 and 22, respectively.

The mixer 16 is illustrated in simplified form for clarity. For example, the mixer 16 may include one or more mixer circuits to produce the I signal 20 and Q signal 22. In one example, the mixer 16 may include a first mixer, directly coupled to local oscillator 18 and RF amplifier 14 for producing the I signal 20, and a second mixer coupled to local oscillator 18 via a 90 degree phase shift for producing the Q signal 22. In another example, mixer 16 may output the I signal 20 and the Q signal 22 as differential signals. In another example (not shown), antenna 12 may be coupled to the mixer 16 via an RF to IF converter. The mixer 16 would then produce the I signal 20 and the Q signal 22 from an IF signal rather than directly from an RF signal.

The I signal 20 in the illustrated embodiment of FIG. 1 is coupled to a first high gain receiver chain 24, which is, in turn, coupled to a first AID converter 26. Similarly, the Q signal 22 is coupled through a second high gain receiver chain 28, which is, in turn, coupled to a second AID converter 30.

In the disclosed example of FIG. 1, high-gain receiver chains 24 and 28 may be substantially identical. However, the invention is not necessarily limited to radio receivers where gain stages for the I and Q signals are substantially identical.

Figure 2:
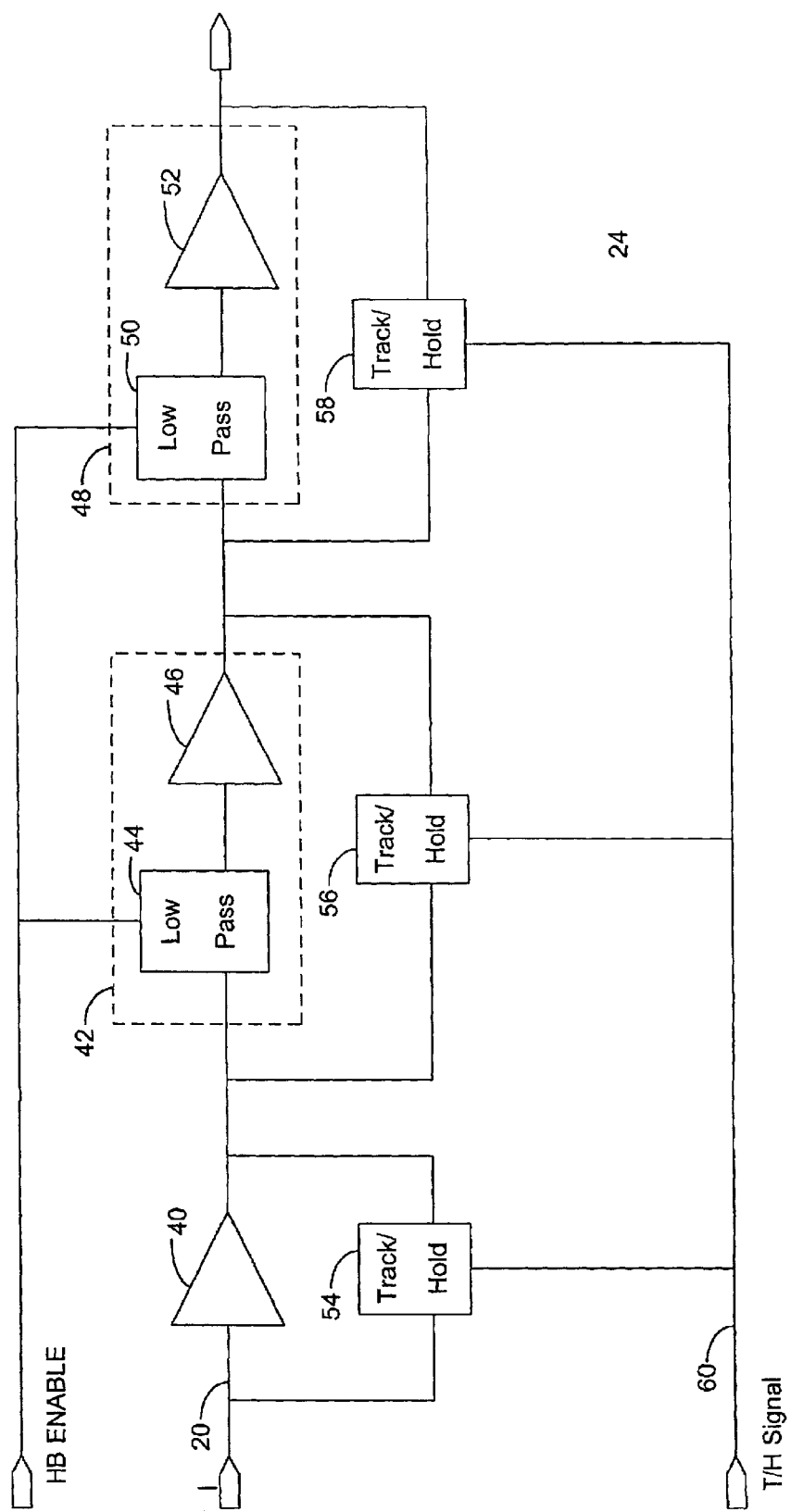
FIG. 2 is a block diagram illustrating an example of a high gain amplifier chain.

FIG. 2 illustrates a specific example of one high gain receiver chain 24 utilizing three stages of amplification and DC offset connection. However, amplifier stages may be added or deleted as a particular design requires. Also, the amplifier stages may be associated with different components of the receiver. For example, the first amplifier stage may be associated with the mixer 16, and may be characterized as an output amplifier of the mixer 16. Such an output amplifier may nevertheless be considered part of the high gain receiver chain 24.

The example of the high gain receiver chain 24 illustrated in FIG. 2 may include a first amplifier stage 40, receiving an input from the mixer 16. An output of the first amplifier stage 42 is coupled to a input of a second amplifier stage 42 comprising a low pass filter 44 in series with an amplifier 46. An output of the second amplifier stage 42 is coupled to an input of a third amplifier stage 48, comprising a low pass filter 50 in series with an amplifier 52. An output of the amplifier 52 is coupled to an AID converter (e.g. AID converter 26 of FIG. 1).

Any uncorrected DC offset in the I signal 20 could be exacerbated by the high gains in amplifier stages 40, 42, and 48. Also, the filtering characteristics of stages 42 and 48 may affect the stability of the DC offset correction loop if not addressed. Also, because there are multiple correction stages, controls for a sequenced DC offset correction may be advantageous. Generally, DC offset corrections for each amplifier stage 40, 42, and 48 are preferably performed before a receive slot begins in a TDMA frame. The speed with which the DC offset corrections are performed is important to power savings because the advance time for receiver enabling is an important factor in determining the standby time of a battery operated wireless phone.

To further reduce the advance time to perform DC offset correction, the low pass filter 44 and the low pass filter 50 may be configured to have switchable bandwidths. The filter bandwidths for the low pass filter 44 and the low pass filter 50 may be increased upon switch-on of the high gain chain 24 just before DC offset correction is performed. If GMC filters are used for the low pass filter 44 and the low pass filter 50, bandwidth may be increased by increasing currents.

For example, if the bandwidth for the low pass filter 44 is $\beta$, the settling time ($t_{settle}$) for correcting DC offset would be on the order of $1/\beta$. Just before DC offset correction, the bandwidth for the low pass filter 44 may be increased to $k\beta$, where k is a constant. In this example, the settling time would be reduced from $t_{settle}$ to $t_{settle}/k$, thereby reducing the time required to perform DC offset correction. When DC offset correction is completed, the bandwidth may be returned to $\beta$.

In the example illustrated in FIG. 2, DC offset correction is performed by track and hold circuits. A first track and hold circuit 54 provides a feedback loop around the first amplifier stage 40, a second track and hold circuit 56 provides a feedback loop around the second amplifier stage 42, and a third track and hold circuit 58 provides a feedback loop around the third amplifier stage 48. Track and hold circuits 54, 56, and 58 are controlled by track and hold signal 60.

Figure 3:
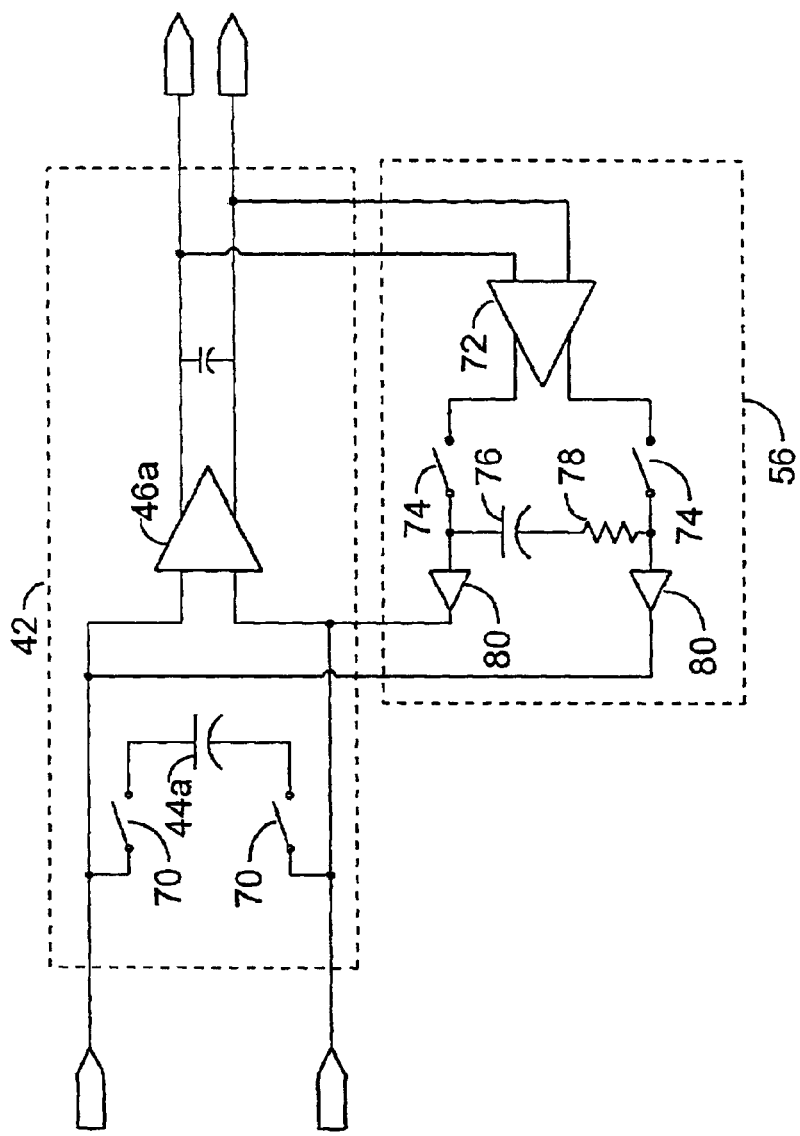
FIG. 3 is a schematic diagram illustrating an example of an amplifier stage of a high gain amplifier chain.

FIG. 3 illustrates an example of a circuit suitable for track and hold circuit 56 in combination with first amplifier stage 42. In the illustrated example, amplifier 46 comprises a differential amplifier 46a and the low pass filter 44 comprises a capacitor 44a selectively coupled across the inputs to the differential amplifier 46a by hold switches 70. "Switches" in this context is not meant to require a mechanical contact type switch. Any switching devices with characteristics suitable for the application (e.g. transistors or logic gates) may be used. The example of the track and hold circuit 56 illustrated in FIG. 3 comprises a track and hold amplifier 72, track switches 74, a holding capacitor 76, a holding resistors 78, and buffers 80. The outputs of differential amplifier 46a are connected to the inputs of the track and hold amplifier 72 as shown. The outputs of track and hold amplifier 72 are selectively coupled to the holding capacitor 76 in series with holding resistor 78 by track switches 74. The buffers 80 couple the voltage stored across the holding capacitor 76 in series with the holding resistor 78 to the inputs of the differential amplifier 46a.

The track switches 74 are closed and hold the switches 70 are opened to put the track and hold circuit 56 in a "tracking" mode. When in tracking mode, the track and hold amplifier 72 stores a voltage corresponding to the DC offset on the holding capacitor 76. The track switches 74 are opened and the switches 70 are closed to put the track and hold circuit 56 in a "holding" mode. When in holding mode, the voltage corresponding to the DC offset is buffered and applied to the opposite inputs of the differential amplifier 46a by the buffers 80. Thus, the voltage corresponding to the DC offset is subtracted from the inputs of the differential amplifier 46a.

The track and hold circuits 54 and 58 illustrated in FIG. 2 may be similarly configured or may use any other track and hold configuration with characteristics suitable for the application. In the illustrated example, using a BiCMOS embodiment, the holding capacitor 76 is small enough to be included on the IC and so saves a discrete component that may otherwise be required on the receive circuit.

Figure 4:
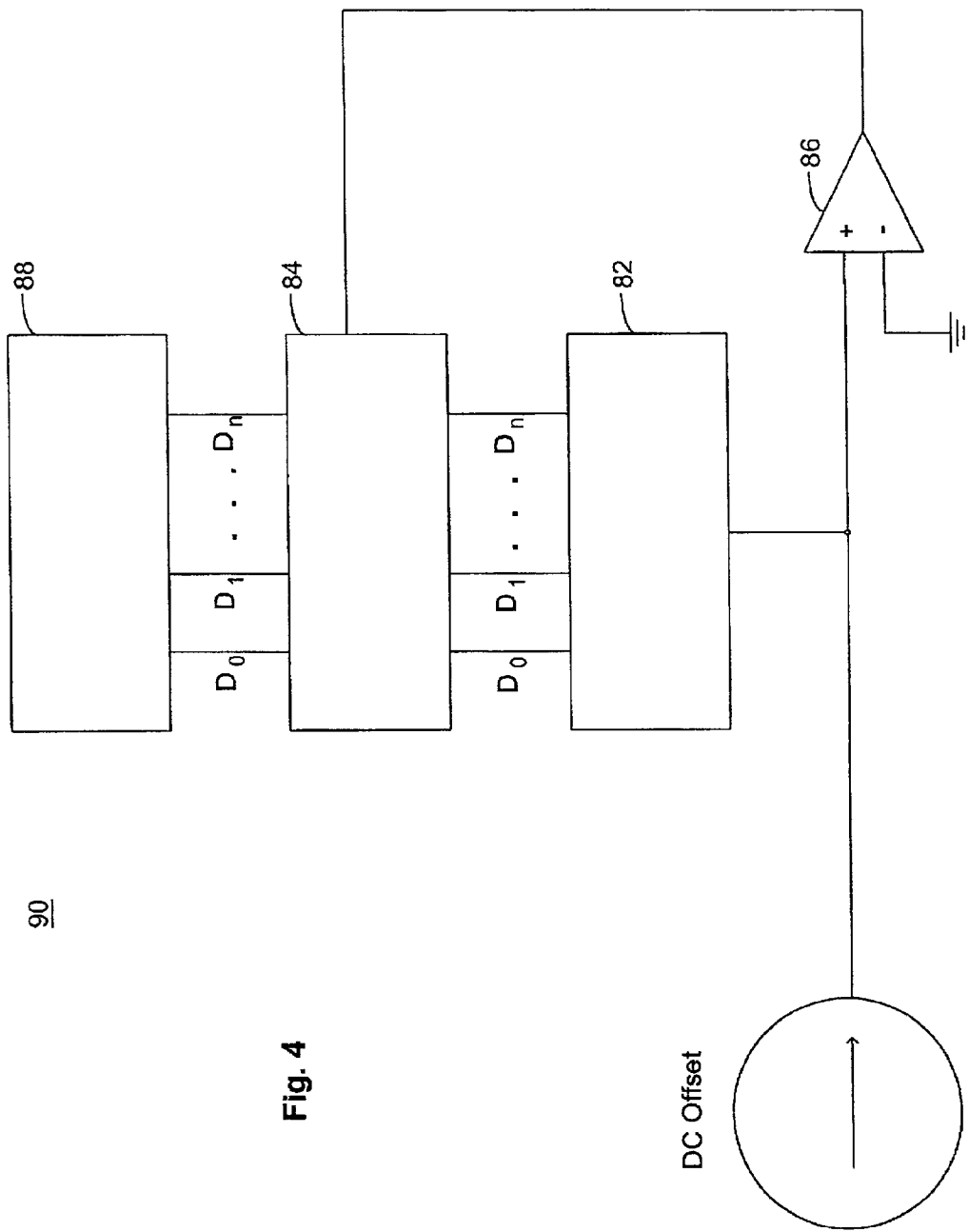
FIG. 4 is a schematic block diagram illustrating an alternative example of a track and hold circuit

FIG. 4 is a block diagram which illustrates another example of a track and hold circuit 90 suitable for use as the track and hold circuit 54, 56, 58 in FIG. 2. In this example, DC offset correction in multiple stages can be performed. DC offset correction may be extracted in current mode. Accordingly, the track and hold circuit 90 illustrated in FIG. 4 includes a current mode Digital to Analog Converter (DAC) 82, a counter 84, and a comparator 86. An output of the DAC 82 and an extracted DC offset current are coupled to a non-inverting input of the comparator 86. A reference voltage, (which may include ground), is coupled to the inverting input of the comparator 86. The output of the comparator 86 is coupled to the counter 84. The output of the counter 84 is connected to the input of the DAC 82.

In operation, the counter 84 is incremented, thereby incrementing the correction current output by the DAC 82. Once the comparator 86 detects that the DC offset has been corrected, the counter 86 is stopped. The output of the counter 86, ($D_o ... D_n$) represents the DC offset and may be stored in a register 88. The register 88 may be any suitable device for storing digital data, including, but not limited to, registers, latches, flip-flops, RAM, software storage locations, etc.

This digital correction may be performed for each stage of the high gain chain and stored digitally. Digital storage of the DC correction permits eliminating the holding capacitors 76, thereby providing a savings in area on an integrated circuit embodiment of a high gain receiver chain.

In operation, in one embodiment, the receiver may be powered up just before the receive timeslot. DC offset correction is performed for each amplifier stage of the high gain chain, and the correction signals are stored, for example, on the integrated circuit in the form of a voltages on integrated holding capacitors 76 or as a digital signal in register 88. The receive timeslot then begins.

DC offset correction is performed as a part of the control sequence before a receive slot. The digital ICs that provide the signals that control gain selection signals and enable signals for the transmitter and receiver sections of the IC, for example, also provide the control signals for the DC offset correction.

DC offset correction may be performed around filter stages that have gain built into them by using pole compensation provided in the track and hold circuitry. The multiple stage offset correction stages may be put into hold mode one by one. In this approach, the DC offset circuitry may be put into the hold state storing correction voltages on on-chip capacitors or a digital implementation of a track and hold circuit.

In an example using a single track and hold control signal 60 as in FIG. 2, on a first positive edge, the first track and hold circuit 54, the second track and hold circuit 56, and the third track and hold circuit 58 go into correction tracking mode. On the next positive edge, the first track and hold circuit 54 goes into hold mode. On the next positive edge, the second track and hold circuit 56 goes into hold mode. On the next positive edge, the third track and hold circuit 58 goes into hold mode.

In another alternative, a simple state machine may be used to perform the track and hold sequencing. An external receiver enable signal can, for example, be used to trigger such a sequence. The track and hold signal 60 may be generated by control blocks generally present in a digital wireless telephone and which provide the signals that enable the receiver and transmitter before their respective slots.

Figure 5:
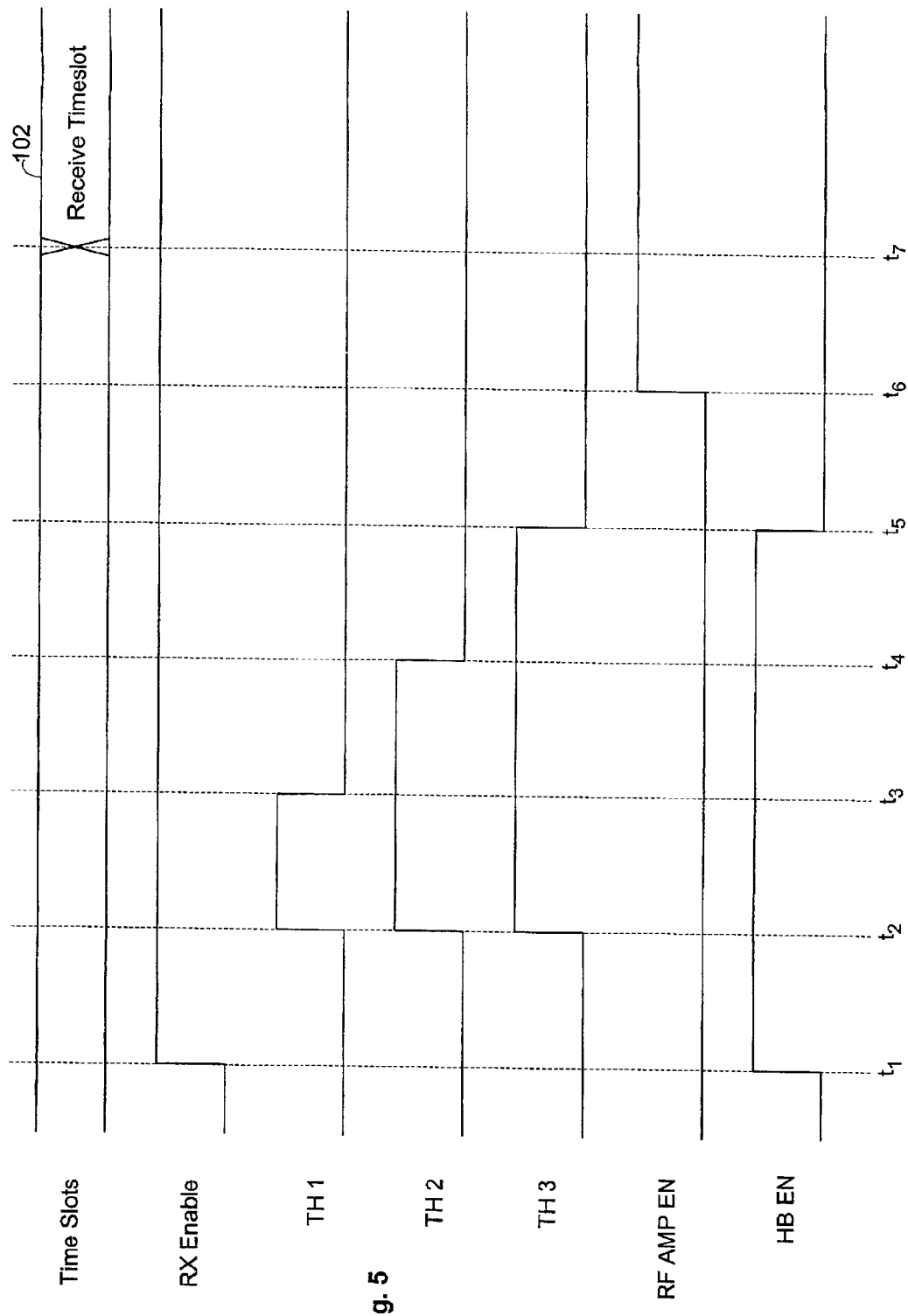
FIG. 5 is a timing diagram illustrating an example of timing for the circuit of FIG. 1.

A timing diagram for an example of a DC offset calibration sequence in reference to the receive timeslot is shown in FIG. 5. The receive timeslot 102 is indicated at time $t_7$. At time $t_1$, the receiver is turned on by setting RX ENABLE active. Optionally, HB EN may also be set active at time $t_1$.

RX ENABLE electrically powers up the receiver portion of the circuitry just before the receive slot occurs. It is a part of the control signal sequencing that forms part of call initiation. HB EN enables high bandwidth operation of low pass filter 44 and low pass filter 50 to reduce settling time for DC offset correction.

At time $t_2$, track and hold circuits 54, 56, and 58 are placed in "tracking" mode, as indicated by TH1, TH2 and TH3, respectively, going to the high state. As indicated above, the track and hold sequence may be controlled by a single control line or multiple control lines. Three separate states are indicated on the timing diagrams for clarity. At time $t_3$, TH1 goes low, indicating that the track and hold circuitry is in a "holding" mode.

At time $t_4$, TH2 goes low, indicating that the second track and hold circuit 56 is set to holding mode. At time $t_5$, TH3 goes low, indicating that the third track and hold circuit 58 is set to holding mode. At time $t_5$, therefore the DC offset has been tracked and corrected for all three amplifier stages 40, 42, and 48 illustrated in FIG. 2. If HB EN had been set active at time $t_1$, it would be reset to inactive at time $t_5$, returning low pass filters 44 and 50 to narrow bandwidth. After a short settling time, at $t_6$, the RF amplifier 15 of the receiver stage is enabled by RF AMP EN going high.

The RF amplifier 14 is not turned on for the correction in order to prevent received signals from corrupting the DC correction. The RF amplifier 14 is turned on for a short time before the receive slot begins at time $t_7$. The duration of time $t_7 - t_6$ depends on whether the calibration is done from frame to frame or from a cold start. The above calibration sequence may also be performed during standby when the phone needs to monitor its receive channels to check for incoming calls.

Figure 6:
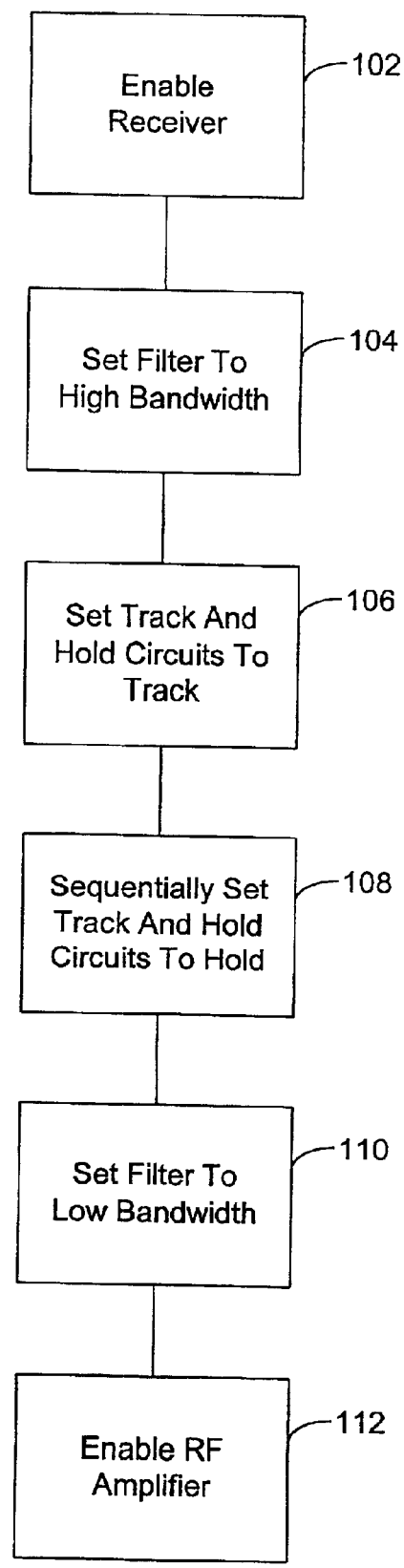
FIG. 6 is an example of a flow chart of an example and set of steps for correcting DC offset.

FIG. 6 is a flow chart of one exemplary method for correcting DC offset in a radio receiver prior to the beginning of a timeslot, typically a receive timeslot. In step 102, a receiver is turned on at a first predetermined time prior to the timeslot. In step 106, at least two track and hold circuits, for example, track and hold circuits 54 and 56 (FIG. 2) are set to the tracking state at a second predetermined time before the timeslot. In step 108, the track and hold circuits are sequentially set to their respective holding states. The timing of the setting the track and hold circuits may be implemented, for example, as illustrated in FIG. 5. In step 112, a radio frequency amplifier is enabled after the track and hold circuits are set to their holding state.

A filter may be set to a narrow bandwidth state during the time that the track and hold circuits are in their tracking state. For example, in step 104, a filter having a narrow bandwidth state and a high bandwidth state is set to its high bandwidth state at or before the time that the track and hold circuits are set to their respective tracking states (step 106). In step 110, the high bandwidth filter is set to its narrow bandwidth at or after the time that the track and hold circuits have been set to their respective holding states (step 108).

In the illustrated example, BiCMOS technology may be used to provide smaller size and integrated passive components such as the holding capacitors. Integrated passive components facilitate longer holding times for the capacitors 44a, spanning over several timeslots. Accordingly, DC offset correction may not need to be performed as often, making multislot operation for GSM much easier. However, the invention is not limited to BiCMOS technology.

Multislot operation refers to more than one slot at a time being used for receive. In situations like those, the correction voltage on the capacitor that decides the DC offset correction needs to be stored for a longer time. Generally, DC offset correction schemes that use a capacitor to store the correction suffer from the problem that the correction voltage degrades with time due to charge leakage. A BiCMOS implementation uses field effect transistors and can hold the correction for much longer, thus making it possible to have more than one receive slot together without requiring correction.

While various embodiments of the invention have been described, it will be apparent to those of ordinary skill in the art that many more embodiments and implementations are possible what are within the scope of the invention.

What is claimed is:

1. An amplifier chain comprising:
   a first amplifier,
   a first track and hold circuit, coupled to the first amplifier and having a tracking state and a holding state;
   a second amplifier, coupled to the first amplifier;
   a second track and hold circuit, coupled to the second amplifier and having a tracking state and a holding state;
   a control circuit which generates a control signal, coupled to the first track and hold circuit and to the second track and hold circuit, the control signal configured to set the first track and hold circuit to the tracking state and to set the second track and hold circuit to the tracking state, and to sequentially set the first track and hold circuit to the holding state and then set the second track and hold circuit to the holding state; and
   a first low pass filter having a narrow bandwidth state and a high bandwidth state coupled in series with the first amplifier output and the second amplifier input.

2. The amplifier chain of claim 1, wherein the control signal sets first and second track and holds circuits to the tracking state substantially simultaneously.

3. The amplifier chain of claim 1, wherein the first and second track and hold circuits comprise:
   a holding capacitor,
   a tracking amplifier selectively coupled to the holding capacitor when the track and hold circuit is in the tracking state; and
   a buffer having a buffer input coupled to the holding capacitor and a buffer output selectively coupled to an input of an amplifier of the amplifier chain when the track and hold circuit is in the holding state.

4. The amplifier chain of claim 1, wherein the first and second track and hold circuits comprise:
   a comparator, having a first input connected to a DC offset current from an amplifier, of the amplifier chain, a second input, connected to a reference signal, and an output;
   a counter, having an input coupled to the output of the comparator and an output;
   a current mode digital to analog converter, having an input connected to the output of the counter and an output connected to the first input of the comparator; and
   data register connected to the output of the counter.

5. The amplifier chain of claim 1 further comprising:
   a high bandwidth control signal, coupled to the first low pass filter.

6. The amplifier chain of claim 1, further comprising:
   a third amplifier, coupled to the second amplifier; and
   a third track and hold circuit, coupled to the third amplifier and having a tracking state and a holding state;

wherein the control signal is further coupled to the third track and hold circuit, the control signal further configured to set the first, second, and third track and hold circuits to their respective tracking states, and further to sequentially set the first track and hold circuit to its holding state, set the second track and hold circuit to its holding state; and set the third track and hold circuit to its holding state.

7. The amplifier chain of claim 6 further comprising:
a second low pass filter having a narrow bandwidth state and a high bandwidth state coupled in series with the second amplifier and the third amplifier input; and
a high bandwidth control signal, coupled to the first low pass filter and coupled to the second low pass filter.

8. An amplifier for use in a radio receiver having a mixer, which generates an in-phase mixer output and a quadrature phase mixer output, the amplifier comprising:
an in-phase amplifier chain, coupled to the in-phase mixer output, the in-phase amplifier chain including:
a first amplifier coupled to a first track and hold circuit;
a second amplifier coupled in series with the first amplifier, the
second amplifier coupled to a second track and hold circuit; and
a first low pass filter having a narrow bandwidth state and a high bandwidth state coupled in series with the first amplifier output and the second amplifier input; and
a quadrature phase amplifier chain, coupled to the quadrature phase mixer output, the quadrature phase amplifier chain including:
a third amplifier coupled to a third track and hold circuit;
a fourth amplifier coupled in series with the third amplifier, the fourth amplifier coupled to a fourth track and hold circuit; and
a second low pass filter having a narrow bandwidth state and a high bandwidth state coupled in series with third amplifier output and the fourth amplifier input; and
a control circuit which generates a control signal coupled to the first, second, third and fourth track and hold circuits, the control signal configured to set the first, second, third and fourth track and hold circuits to a tracking state, and configured to sequentially set the first track and hold circuit, to a holding state and set the second track and hold circuit to a holding state, and to sequentially set the third track and hold circuit to a holding state and set the fourth track and hold circuit to a holding state.

9. The amplifier of claim 8 further comprising:
a first low pass filter having a narrow bandwidth state and a high bandwidth state coupled in series with the first amplifier and the second amplifier;
a second low pass filter having a narrow bandwidth state and a high bandwidth state coupled in series with the third amplifier and the fourth amplifier; and
a high bandwidth control signal, coupled to the first and second low pass filters.

10. An amplifier chain comprising:
a first means for amplifying;
a first means for correcting DC offset coupled to the first means for amplifying, the first means for correcting DC offset further having a tracking state and a holding state;
a second means for amplifying, coupled to the first means for amplifying;
a second means for correcting DC offset coupled to the second means for amplifying the second means for correcting DC offset having a tracking state and a holding state;
means for controlling the states of the first means for correcting DC offset and the second means for correcting DC offset, the means for controlling further comprising a means for setting the first means for correcting DC offset to the tracking state, for setting the second means for correcting DC offset to the tracking state, and for sequentially setting the first means for correcting DC offset to the holding state and setting the second means for correcting DC offset to the holding state; and
first means for filtering having a narrow bandwidth state and a high bandwidth state, the first means for filtering coupled in series with the first means for amplifying and the second means for amplifying.

11. The amplifier chain of claim 10, wherein the means for controlling further comprises means for setting the first means for correcting DC offset and the second means for correcting DC offset to the tracking state substantially simultaneously.

12. The amplifier chain of claim 10, wherein each for correcting DC offset comprises:
means for holding DC offset voltage of a means for amplifying,
means for tracking the DC offset voltage and for selectively applying the DC offset voltage to the means for holding; and
means for selectively applying the DC offset voltage to an input of the means for amplifying.

13. The amplifier chain of claim 10, wherein each means for correcting DC offset comprises:
means for generating DC offset correction current based on a digital input signal;
means for comparing a sum of a DC offset current from a means for amplifying and the DC offset correction current with a reference;
means for incrementing the digital input signal when the means for comparing detects that the DC offset current from an amplifier is not corrected by the DC offset correction current, the means for incrementing the digital input signal connected to the means for generating a DC offset correction current; and
means for storing the digital input signal when the means for comparing detects that the DC offset current from a means for amplifying is corrected by the DC offset correction current, the means for storing connected to the means for incrementing the digital input signal.

14. The amplifier chain of claim 10 further comprising:
means for controlling the bandwidth of the first means for filtering.

15. The amplifier chain of claim 10, further comprising:
third means for amplifying, coupled to the second means for amplifying; and
third means for correcting DC offset, coupled to the third means for amplifying, the third means for correcting DC offset having a tracking state and a holding state;
wherein the means for controlling further comprises means for controlling the state of the third means for correcting DC offset, the means for controlling further comprising a means for setting the third means for correcting DC offset to the tracking state and for sequentially setting the first means for correcting DC offset to the holding state, setting the second means for correcting DC offset to the holding state, and setting the third means for correcting DC offset to the holding state.

16. The amplifier chain of claim 15 further comprising:

second means for filtering having a narrow bandwidth state and a high bandwidth state coupled in series with the second means for amplifying and the third means for amplifying; and means for controlling the bandwidth of the first and second means for filtering.

17. A method for correcting DC offset in an amplifier chain having at least first and second amplifiers coupled in series, each amplifier being coupled to a track and hold circuit having a tracking state and a holding state, the amplifier chain also including at least one filter having a narrow bandwidth state and a high bandwidth state the filter coupled in series with the first and second amplifiers, comprising:

setting a first track and hold circuit to the tracking state;

setting a second track and hold circuit to the tracking state;

setting the first track and hold circuit to the holding state;

setting the second track and hold circuit to the holding state after setting the first track and hold circuit to the holding state, wherein the second track and hold circuit is subsequent to the first track and hold circuit in the amplifier chain;

setting the filter to the high bandwidth state while the track and hold circuits are in the tracking state; and setting the filter to narrow bandwidth state when the track and hold circuits are in the holding state.

18. The method as recited in claim 17, wherein the steps of setting the first track and hold circuit to the tracking state occurs substantially simultaneously with the step of setting the second track and hold circuit to the tracking state.

19. A method for correcting DC offset in a radio circuit prior to a time slot in a time division multiplex format, the radio circuit having at least first and second amplifier stages, the method comprising:

turning on at least a portion or the radio circuit at a first time prior to the timeslot;

activating tracking of the DC offset in at least the first and second amplifier stages after the first time and before the timeslot;

activating a holding state to hold the DC offset of at least the first and second amplifier stages at a time after tracking is activated and before the timeslot;

enabling the radio frequency amplifier at a time before the timeslot, but occurring after activating the holding state.

20. The method as recited in claim 19, wherein at least one amplifier stage has a filter having a narrow bandwidth state and a high bandwidth state, further comprising the steps of:

setting the filter to the high bandwidth state at a time prior to the timeslot, but occurring no later than the time of activating tracking; and setting the filter to the narrow bandwidth state at a time prior to the timeslot, and occurring no earlier than the time the holding state is activated.

21. The method of claim 19 wherein the step of activating tracking comprises comparing the DC offset of at least the first and second amplifier stages to a reference.

* * * * *